United States Patent
Masuda et al.

(10) Patent No.: US 10,879,103 B2
(45) Date of Patent: Dec. 29, 2020

(54) MOUNTING MEMBER

(71) Applicant: NITTO DENKO CORPORATION, Ibaraki (JP)

(72) Inventors: Shotaro Masuda, Ibaraki (JP); Tomoaki Ichikawa, Ibaraki (JP); Yohei Maeno, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 357 days.

(21) Appl. No.: 16/069,934

(22) PCT Filed: Jan. 10, 2017

(86) PCT No.: PCT/JP2017/000440
§ 371 (c)(1),
(2) Date: Jul. 13, 2018

(87) PCT Pub. No.: WO2017/122622
PCT Pub. Date: Jul. 20, 2017

(65) Prior Publication Data
US 2019/0051550 A1 Feb. 14, 2019

(30) Foreign Application Priority Data
Jan. 15, 2016 (JP) ................. 2016-006146

(51) Int. Cl.
H01L 21/683 (2006.01)
B82Y 30/00 (2011.01)
(Continued)

(52) U.S. Cl.
CPC ........... *H01L 21/683* (2013.01); *B82Y 30/00* (2013.01); *C01B 32/158* (2017.08); *C09J 1/00* (2013.01);
(Continued)

(58) Field of Classification Search
CPC . C01B 32/158; C01B 2202/08; H01L 21/687; H01L 21/68757; Y10S 977/742;
(Continued)

(56) References Cited

U.S. PATENT DOCUMENTS 8,025,971 B2 * 9/2011 Maeno ................. C09J 7/00
428/398
9,218,917 B2 * 12/2015 Brambilla ............. H01G 11/28
(Continued)

FOREIGN PATENT DOCUMENTS

| EP | 2 051 289 A1 | 4/2009 |
|----|----|----|
| JP | 2001-351961 A | 12/2001 |

(Continued)

OTHER PUBLICATIONS

Extended European Search Report dated Jun. 26, 2019, from the European Patent Office in application No. 17738376.7.
(Continued)

*Primary Examiner* — Tyrone V Hall, Jr.
(74) *Attorney, Agent, or Firm* — Sughrue Mion, PLLC

(57) ABSTRACT

Provided is a mounting member that is excellent in low dusting property and hardly contaminates an object to be mounted while being excellent in gripping force and heat resistance. The mounting member of the present invention includes an aggregate of carbon nanotubes for forming a mounting surface, wherein a ratio of a plan view area of recessed portions occurring in a carbon nanotube aggregate-side surface of the mounting member to a total area of the carbon nanotube aggregate-side surface is 5% or less.

7 Claims, 1 Drawing Sheet

(51) Int. Cl.
*C01B 32/158* (2017.01)
*H01L 21/677* (2006.01)
*C09J 1/00* (2006.01)
*C09J 7/20* (2018.01)
*C09J 7/00* (2018.01)

(52) U.S. Cl.
CPC . *C09J 7/00* (2013.01); *C09J 7/20* (2018.01); *H01L 21/677* (2013.01); *C01B 2202/06* (2013.01); *C01B 2202/36* (2013.01)

(58) Field of Classification Search
CPC . Y10S 977/842; Y10S 977/843; B82Y 30/00; B82Y 40/00
See application file for complete search history.

(56) References Cited

U.S. PATENT DOCUMENTS

| | | | |
|---|---|---|---|
| 9,606,041 B2 * | 3/2017 | Maeno | B01L 3/0289 |
| 2004/0184981 A1 * | 9/2004 | Liu | B82Y 40/00 |
| | | | 423/447.3 |
| 2005/0208304 A1 | 9/2005 | Collier et al. | |
| 2006/0068195 A1 * | 3/2006 | Majumdar | B32B 37/00 |
| | | | 428/323 |
| 2008/0216565 A1 * | 9/2008 | Ceres | G01Q 60/40 |
| | | | 73/105 |
| 2011/0086464 A1 | 4/2011 | Kim et al. | |

FOREIGN PATENT DOCUMENTS

| | | |
|---|---|---|
| JP | 2004-253224 A | 9/2004 |
| JP | 2007-145631 A | 6/2007 |
| JP | 2013-138152 A | 7/2013 |
| JP | 2015-053440 A | 3/2015 |
| TW | 201219294 A1 | 5/2012 |
| WO | 2008/152940 A1 | 12/2008 |
| WO | 2009/054461 A1 | 4/2009 |

OTHER PUBLICATIONS

International Search Report of PCT/JP2017/000440 dated Apr. 4, 2017.
Office Action dated Jul. 15, 2020, from the Intellectual Property Office of Taiwan in Application No. 106101201.

* cited by examiner

MOUNTING MEMBER

CROSS REFERENCE TO RELATED APPLICATIONS

This application is a National Stage of International Application No. PCT/JP2017/000440 filed Jan. 10, 2017, claiming priority based on Japanese Patent Application No. 2016-006146 filed Jan. 15, 2016.

TECHNICAL FIELD

The present invention relates to a mounting member.

BACKGROUND ART

In transporting a material, a production intermediate, a product, or the like (hereinafter sometimes referred to as "object to be processed") in a manufacturing process for a semiconductor device or the like, the object to be processed is transported through use of a carrying member, such as a movable arm or a movable table (see, for example, Patent Literatures 1 and 2). In such transport, there is a demand for a member on which the object to be processed is to be mounted (mounting member) to have such a strong gripping force as to prevent the object to be processed from shifting in position while being transported. In addition, such demand has increased year by year along with a demand for a faster manufacturing process.

However, a related-art mounting member is formed of an elastic material, such as a resin, and has a problem in that the elastic material is liable to adhere and remain on the object to be processed and contaminates the object to be processed. In addition, the mounting member formed of the elastic material, such as a resin, has low heat resistance, and has a problem in that its gripping force is reduced under a high temperature environment.

When a material such as ceramics is used for the mounting member, contamination of the object to be processed is prevented, and temperature dependence of a gripping force is reduced. However, a mounting member formed of such material has a problem of inherently having a weak gripping force, and being unable to sufficiently retain the object to be processed even at normal temperature.

CITATION LIST

Patent Literature

[PTL 1] JP 2001-351961 A
[PTL 2] JP 2013-138152 A

SUMMARY OF INVENTION

Technical Problem

An object of the present invention is to provide a mounting member that is excellent in low dusting property and hardly contaminates an object to be mounted while being excellent in gripping force and heat resistance.

Solution to Problem

According to one embodiment of the present invention, there is provided a mounting member, including an aggregate of carbon nanotubes for forming a mounting surface, wherein a ratio of a plan view area of recessed portions occurring in a carbon nanotube aggregate-side surface of the mounting member to a total area of the carbon nanotube aggregate-side surface is 5% or less.

In one embodiment, the mounting member of the present invention further includes a substrate, wherein the aggregate of the carbon nanotubes is fixed to the substrate.

In one embodiment, opening portions of the recessed portions each have a diameter of 1,000 µm or less.

In one embodiment, a number of the recessed portions is 80 recessed portions/cm$^2$ or less.

In one embodiment, the carbon nanotube aggregate-side surface has a coefficient of static friction against a glass surface of 2.0 or more.

In one embodiment, an average of diameters of the carbon nanotubes is from 1 nm to 800 nm.

In one embodiment, a portion including a tip of each of the carbon nanotubes is covered with an inorganic material.

In one embodiment, the mounting member of the present invention is used in transport of a semiconductor part.

Advantageous Effects of Invention

According to the present invention, the mounting member that is excellent in low dusting property and hardly contaminates an object to be mounted while being excellent in gripping force and heat resistance can be provided.

DESCRIPTION OF EMBODIMENTS

A mounting member of the present invention includes a carbon nanotube aggregate. The carbon nanotube aggregate forms the mounting surface of the mounting member. The carbon nanotube aggregate has a satisfactory pressure-sensitive adhesive property (friction property), and hence can satisfactorily retain an object to be mounted that is mounted on the mounting member.

A. Mounting Member

Figure 1:
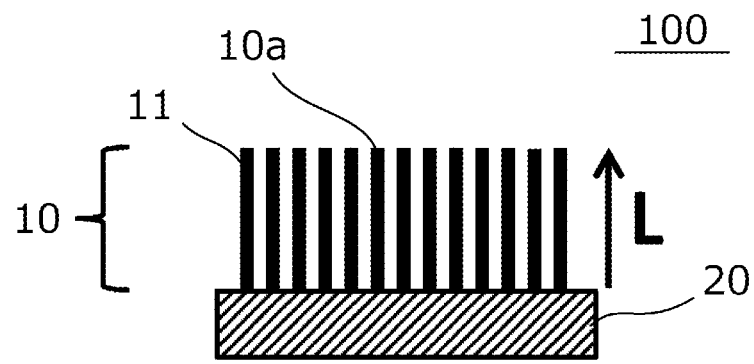
FIG. 1 is a schematic sectional view of a mounting member according to one embodiment of the present invention.

FIG. 1 is a schematic sectional view of a mounting member according to one embodiment of the present invention. A mounting member 100 includes a carbon nanotube aggregate 10.

In one embodiment, as illustrated in FIG. 1, the mounting member 100 further includes a substrate 20. In FIG. 1 (and FIG. 2 to be described later), a mode in which the carbon nanotube aggregate 10 is arranged on one side of the substrate 20 is illustrated. However, the carbon nanotube aggregate 10 may be arranged on each of both sides of the substrate 20.

The carbon nanotube aggregate 10 includes a plurality of carbon nanotubes 11. One end of each of the carbon nanotubes 11 is fixed to the substrate 20. The carbon nanotubes 11 are each aligned in the direction of a length L, and the carbon nanotube aggregate 10 is formed as a fibrous columnar structure. The carbon nanotubes 11 are each preferably aligned in a direction substantially perpendicular to the substrate 20. The term "direction substantially perpendicular" as used herein means that an angle with respect to the surface of the substrate 20 is preferably 90°±2°, more preferably 90°±15°, still more preferably 90°±10°, particularly preferably 90°±5°.

Figure 2:
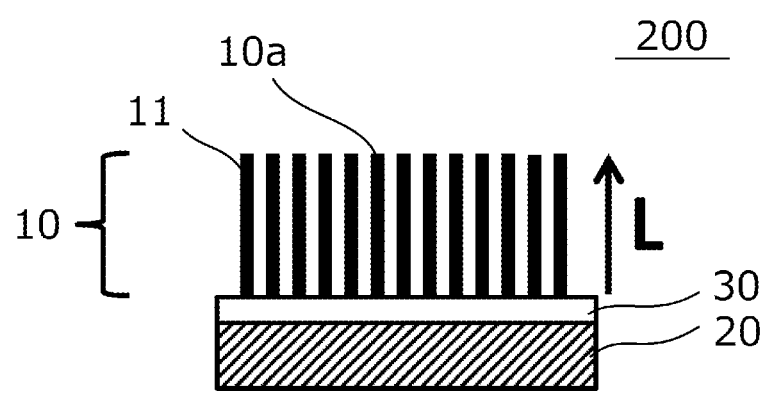
FIG. 2 is a schematic sectional view of a mounting member according to another embodiment of the present invention.

In another embodiment, as illustrated in FIG. 2, a mounting member 200 further includes the substrate 20 and a binder 30. In this embodiment, one end of each of the carbon nanotubes 11 is fixed to the binder 30.

The mounting member of the present invention is excellent in low dusting property. The use of such mounting member can significantly prevent the contamination of an object to be mounted. The mounting member of the present invention is suitably used for an object to be mounted required to have high cleanness because of its low dusting property. The mounting member of the present invention is suitably used in the transport of an object to be processed (e.g., a semiconductor wafer, a semiconductor part, such as a semiconductor device, or a glass substrate) in, for example, a manufacturing process for a semiconductor device or a manufacturing process for an optical member, and when the object to be processed is transported by mounting the object to be processed on the mounting member, the process can be advanced while the cleanness of the object to be processed is maintained. In addition, the mounting member of the present invention can also be suitably used as a mounting member to be used in an analyzer. In addition, the mounting member including the carbon nanotube aggregate exhibits an excellent friction characteristic even under a high-temperature environment (e.g., 400° C. or more, preferably from 500° C. to 1,000° C., more preferably from 500° C. to 700° C.) because the mounting member is excellent in heat resistance. The mounting member of the present invention is particularly useful in, for example, a wafer processing step (so-called front-end step) in a manufacturing process for a semiconductor device because the mounting member is excellent in low dusting property and heat resistance. The effects as described above can be obtained by improving, for example, the uniformity of the carbon nanotubes, specifically, the uniformity of the diameters of the carbon nanotubes present in plurality, the uniformity of the wall numbers of the carbon nanotubes each having a multi-walled structure, or the like.

When the mounting member is mounted on a silicon wafer so that its carbon nanotube aggregate-side surface may be in contact with the silicon wafer, and the resultant is left to stand for 30 seconds while a load of 100 g is applied from above the mounting member, the number of particles each having a diameter of 0.2 μm or more, the particles being transferred onto the silicon wafer, is preferably 150 particles/cm$^2$ or less, more preferably 100 particles/cm$^2$ or less, still more preferably 50 particles/cm$^2$ or less. Although the number of the particles is preferably as small as possible, a lower limit therefor is, for example, 10 particles/cm$^2$ (preferably 5 particles/cm$^2$). The "carbon nanotube aggregate-side surface" is the mounting surface of the mounting member, and refers to a surface 10a of the carbon nanotube aggregate 10 opposite to the substrate 20 in each of FIG. 1 and FIG. 2.

The ratio of the plan view area of recessed portions occurring in the carbon nanotube aggregate-side surface of the mounting member to the total area of the carbon nanotube aggregate-side surface is 5% or less, preferably 3% or less, more preferably 2% or less, still more preferably 1% or less, most preferably 0%. When a carbon nanotube aggregate having a small plan view area of recessed portions is formed, a mounting member excellent in low dusting property can be obtained. Specifically, a mounting member reduced in transfer of particles onto a silicon wafer as described above can be obtained. The "plan view area of recessed portions" means the total sum of the areas of the opening portions of the recessed portions in the carbon nanotube aggregate-side surface, and may be measured by observing the carbon nanotube aggregate-side surface with a microscope, such as a SEM. In addition, the "recessed portions" mean recessed portions whose opening portions each have a diameter of 10 μm or more. The "recessed portions" may be typically produced by the loss of the carbon nanotube aggregate.

The diameter of each of the opening portions of the recessed portions is preferably 1,000 μm or less, more preferably 500 μm or less, still more preferably 100 μm or less. When the diameter falls within such range, a mounting member excellent in low dusting property can be obtained.

The number of the recessed portions is preferably 80 recessed portions/cm$^2$ or less, more preferably 50 recessed portions/cm$^2$ or less, still more preferably 20 recessed portions/cm$^2$ or less, even still more preferably 10 recessed portions/cm$^2$ or less, particularly preferably 5 recessed portions/cm$^2$ or less, most preferably 0 recessed portions/cm$^2$. When the number falls within such range, a mounting member excellent in low dusting property can be obtained.

The coefficient of static friction of the carbon nanotube aggregate-side surface of the mounting member against a glass surface is preferably 1.0 or more. An upper limit value for the coefficient of static friction is preferably 20. When the coefficient of static friction falls within such range, a mounting member excellent in gripping property can be obtained. Needless to say, the mounting member having a large coefficient of friction against the glass surface can express a strong gripping property also against an object to be mounted including a material except glass (e.g., a semiconductor wafer).

A-1. Carbon Nanotube Aggregate

The carbon nanotube aggregate includes a plurality of carbon nanotubes.

The diameters (individual values) of the carbon nanotubes are preferably from 0.3 nm to 1,000 nm, more preferably from 1 nm to 500 nm, still more preferably from 2 nm to 200 nm, particularly preferably from 2 nm to 100 nm. When the diameters of the carbon nanotubes are adjusted to fall within the range, the carbon nanotubes can have both excellent mechanical characteristics and a high specific surface area, and moreover, the carbon nanotubes can provide a carbon nanotube aggregate exhibiting an excellent friction characteristic.

The average of the diameters of the carbon nanotubes is preferably from 1 nm to 800 nm, more preferably from 2 nm to 100 nm, still more preferably from 5 nm to 50 nm, particularly preferably from 5 nm to 40 nm, most preferably 5 nm or more and less than 10 nm. When the average falls within such range, amounting member excellent in low dusting property can be obtained. The average of the diameters of the carbon nanotubes means an average (on a number basis) calculated as follows: the carbon nanotubes forming the carbon nanotube aggregate are observed with a transmission electron microscope (TEM); the diameters of 30 randomly sampled carbon nanotubes are measured; and the average is calculated from the measured values. A sample for TEM observation may be produced by: loading the carbon nanotubes to be subjected to the measurement and about 5 mL of ethanol into a 10-milliliter glass bottle; subjecting the mixture to an ultrasonic treatment for about 10 minutes to prepare a carbon nanotube-dispersed liquid;

then fractionating the dispersed liquid with a micropipette; dropping several droplets of the dispersed liquid onto a microgrid (sample-retaining mesh) for TEM observation; and then air-drying the resultant.

The standard deviation of the diameters of the carbon nanotubes is preferably 3 nm or less, more preferably 2.5 nm or less, still more preferably 2 nm or less, particularly preferably 1.8 nm or less, most preferably 1 nm or less. A mounting member excellent in low dusting property can be obtained by reducing the standard deviation of the diameters of the carbon nanotubes, that is, forming a carbon nanotube aggregate showing a small variation in diameter. Although the standard deviation of the diameters of the carbon nanotubes is preferably as small as possible, a lower limit value therefor is, for example, 0.1 nm. The standard deviation of the diameters of the carbon nanotubes means a standard deviation based on values measured as follows and the average (on a number basis) of the measured values: the carbon nanotubes forming the carbon nanotube aggregate are observed with a transmission electron microscope (TEM); and the diameters of 30 randomly sampled carbon nanotubes are measured.

Regarding the shape of each of the carbon nanotubes, the lateral section of the carbon nanotube only needs to have any appropriate shape. The lateral section is of, for example, a substantially circular shape, an oval shape, or an n-gonal shape (n represents an integer of 3 or more).

In one embodiment, the carbon nanotubes each have a multi-walled structure. The standard deviation of the wall numbers of the carbon nanotubes each having a multi-walled structure is preferably 3 or less, more preferably 2 or less, still more preferably 1.7 or less, particularly preferably 1 or less. A mounting member excellent in low dusting property can be obtained by reducing the standard deviation of the wall numbers of the carbon nanotubes, that is, forming a carbon nanotube aggregate showing a small variation in wall number. Although the standard deviation of the wall numbers of the carbon nanotubes is preferably as small as possible, a lower limit value therefor is, for example, 0.1. The standard deviation of the wall numbers of the carbon nanotubes means a standard deviation based on values measured as follows and the average (on a number basis) of the measured values: the carbon nanotubes forming the carbon nanotube aggregate are observed with a transmission electron microscope (TEM); and the wall numbers of 30 randomly sampled carbon nanotubes are measured.

In one embodiment, the mode of the wall number distribution of the carbon nanotubes is present at 10 walls or less in number, and the relative frequency of the mode is 30% or more. When the carbon nanotube aggregate adopts such construction, a mounting member that has a high gripping force and is excellent in low dusting property can be obtained.

The distribution width of the wall number distribution of the carbon nanotubes is preferably 9 walls or less, more preferably from 1 wall to 9 walls, still more preferably from 2 walls to 8 walls, particularly preferably from 3 walls to 8 walls. When the distribution width of the wall number distribution of the carbon nanotubes is adjusted to fall within such range, a mounting member that has a strong gripping force and is excellent in low dusting property can be formed.

The maximum wall number of the wall numbers of the carbon nanotubes is preferably from 1 to 20, more preferably from 2 to 15, still more preferably from 3 to 10. When the maximum wall number of the wall numbers of the carbon nanotubes is adjusted to fall within such range, a mounting member that has a strong gripping force and is excellent in low dusting property can be formed.

The minimum wall number of the wall numbers of the carbon nanotubes is preferably from 1 to 10, more preferably from 1 to 5. When the minimum wall number of the wall numbers of the carbon nanotubes is adjusted to fall within such range, a mounting member that has a strong gripping force and is excellent in low dusting property can be formed.

The relative frequency of the mode of the wall number distribution of the carbon nanotubes is preferably 30% or more, more preferably from 30% to 100%, still more preferably from 30% to 90%, particularly preferably from 30% to 80%, most preferably from 30% to 70%. When the relative frequency of the mode of the wall number distribution of the carbon nanotubes is adjusted to fall within the range, the carbon nanotubes can have both excellent mechanical properties and a high specific surface area, and moreover, the carbon nanotubes can provide a carbon nanotube aggregate exhibiting an excellent friction characteristic. Therefore, a mounting member including such carbon nanotube aggregate is excellent in gripping force and low dusting property.

The mode of the wall number distribution of the carbon nanotubes is present at preferably 10 or less walls in number, more preferably from 1 wall to 10 walls in number, still more preferably from 2 walls to 8 walls in number, particularly preferably from 2 walls to 6 walls in number. When the mode of the wall number distribution of the carbon nanotubes is adjusted to fall within the range, the carbon nanotubes can have both excellent mechanical properties and a high specific surface area, and moreover, the carbon nanotubes can provide a carbon nanotube aggregate exhibiting an excellent friction characteristic. Therefore, a mounting member including such carbon nanotube aggregate is excellent in gripping force and low dusting property.

The length of each of the carbon nanotubes is preferably 50 µm or more, more preferably from 100 µm to 3,000 µm, still more preferably from 300 µm to 1,500 µm, even still more preferably from 400 µm to 1,000 µm, particularly preferably from 500 µm to 900 µm. When the length of each of the carbon nanotubes is adjusted to fall within the range, the carbon nanotubes can have both excellent mechanical properties and a high specific surface area, and moreover, the carbon nanotubes can provide a carbon nanotube aggregate exhibiting an excellent friction characteristic. Therefore, a mounting member including such carbon nanotube aggregate is excellent in gripping force and low dusting property.

The specific surface area and density of the carbon nanotubes may be set to any appropriate values.

In one embodiment, a portion including the tip of each of the carbon nanotubes is covered with an inorganic material. The "portion including the tip" as used herein means a portion including at least the tip of each of the carbon nanotubes (tip of each of the carbon nanotubes opposite to the substrate).

In each of all the carbon nanotubes forming the carbon nanotube aggregate, the portion including the tip thereof may be covered with the inorganic material, or in each of part of the carbon nanotubes forming the carbon nanotube aggregate, the portion including the tip thereof may be covered with the inorganic material. The content of such carbon nanotubes that the portion including the tip of each of the carbon nanotubes is covered with the inorganic material is preferably from 50 wt % to 100 wt %, more preferably from 60 wt % to 100 wt %, still more preferably from 70 wt % to 100 wt %, even still more preferably from 80 wt % to 100 wt %, particularly preferably from 90 wt % to 100 wt %, most preferably substantially 100 wt % with respect to the total amount of the carbon nanotubes forming the carbon nanotube aggregate. When the content falls within such range, a mounting member that has a high gripping force and is excellent in low dusting property can be formed.

The thickness of the covering layer of the portion including the tip of each of the carbon nanotubes is preferably 1 nm or more, more preferably 3 nm or more, still more preferably 5 nm or more, even still more preferably 7 nm or more, particularly preferably 9 nm or more, most preferably 10 nm or more. An upper limit value for the thickness of the covering layer is preferably 50 nm, more preferably 40 nm, still more preferably 30 nm, particularly preferably 20 nm, most preferably 15 nm. When the thickness falls within such range, a mounting member that has a high gripping force and is excellent in low dusting property can be formed.

The length of the covering layer is preferably from 1 nm to 1,000 nm, more preferably from 5 nm to 700 nm, still more preferably from 10 nm to 500 nm, particularly preferably from 30 nm to 300 nm, most preferably from 50 nm to 100 nm. When the length falls within such range, a mounting member that has a high gripping force and is excellent in low dusting property can be formed.

Any appropriate inorganic material may be adopted as the inorganic material to the extent that the effects of the present invention are not impaired. Examples of such inorganic material include $SiO_2$, $Al_2O_3$, $Fe_2O_3$, $TiO_2$, MgO, Cu, Ag, and Au.

A-2. Substrate

Any appropriate substrate may be adopted as the substrate in accordance with purposes. Examples thereof include quartz glass, silicon (e.g., a silicon wafer), an engineering plastic, a super engineering plastic, and a metal, such as aluminum. Specific examples of the engineering plastic and the super engineering plastic include polyimide, polyethylene, polyethylene terephthalate, acetylcellulose, polycarbonate, polypropylene, and polyamide. Any appropriate physical properties may be adopted as the various physical properties of any such substrate, such as a molecular weight, to the extent that the object of the present invention can be achieved.

The thickness of the substrate may be set to any appropriate value in accordance with purposes. For example, when a silicon substrate is used, the thickness of the silicon substrate is preferably from 100 μm to 10,000 μm, more preferably from 100 μm to 5,000 μm, still more preferably from 100 μm to 2,000 μm.

The surface of the substrate may be subjected to a commonly used surface treatment, such as a chemical or physical treatment, for example, a chromic acid treatment, ozone exposure, flame exposure, exposure to high-voltage electric shock, or an ionizing radiation treatment, or a coating treatment with an undercoating agent (e.g., an adherent material), in order that the adhesiveness of the substrate with an adjacent layer, the retentivity thereof, and the like may be improved.

The substrate may be formed of a single layer, or may be formed of a plurality of layers.

A-3. Binder

Any appropriate binder may be adopted as the binder as long as the binder has such an effect that the substrate and the carbon nanotube aggregate can be bonded to each other. Examples of such binder include carbon paste, alumina paste, silver paste, nickel paste, gold paste, aluminum paste, titanium oxide paste, iron oxide paste, chromium paste, aluminum, nickel, chromium, copper, gold, and silver. In addition, the binder may be formed of any appropriate adhesive.

B. Method of Manufacturing Mounting Member

A method of manufacturing the mounting member of the present invention is, for example, a method involving transferring the carbon nanotube aggregate formed on a smooth plate onto the substrate (preferably a method involving fixing the aggregate to the substrate through the binder), or a method involving directly forming the carbon nanotube aggregate on a smooth plate that may be used as the substrate. In addition, the mounting member may be manufactured by bonding a smooth plate having formed thereon the carbon nanotube aggregate and the substrate to each other.

In one embodiment, the method of manufacturing the mounting member includes:

(step a) a step of preparing a smooth plate A1 having a predetermined shape;

(step b) a step of forming a catalyst layer on the smooth plate A1; and (step c) a step of forming the carbon nanotube aggregate on a smooth plate A2 having formed thereon the catalyst layer.

Any appropriate smooth plate may be adopted as the smooth plate. The smooth plate is, for example, a material having smoothness and high-temperature heat resistance enough to resist the production of the carbon nanotubes. Examples of such material include quartz glass, silicon (e.g., a silicon wafer), and a metal plate made of, for example, aluminum.

The smooth plate A1 may have any appropriate shape in accordance with purposes. The smooth plate typically has a rectangular shape. In one embodiment, the step a includes dividing a large-area smooth plate A0 into individual pieces by any appropriate method to provide the smooth plate A1 having a predetermined shape.

It is preferred that the smooth plate A1 prepared in the step a and a smooth plate A3 after the step c be substantially identical in shape to each other and substantially identical in size to each other. That is, it is preferred that the method do not include a step of dividing the smooth plate A1, the smooth plate A2 having formed thereon the catalyst layer, and the smooth plate A3 having formed thereon the carbon nanotube aggregate into individual pieces after the step a. After the formation of the carbon nanotube aggregate (after the step c), the resultant mounting member may be divided into individual pieces.

The carbon nanotube aggregate may be formed by a method involving forming the catalyst layer on the smooth plate A1 in the step b and filling a carbon source in the step c under a state in which the catalyst layer is activated to grow carbon nanotubes, that is, chemical vapor deposition (CVD).

Figure 3:
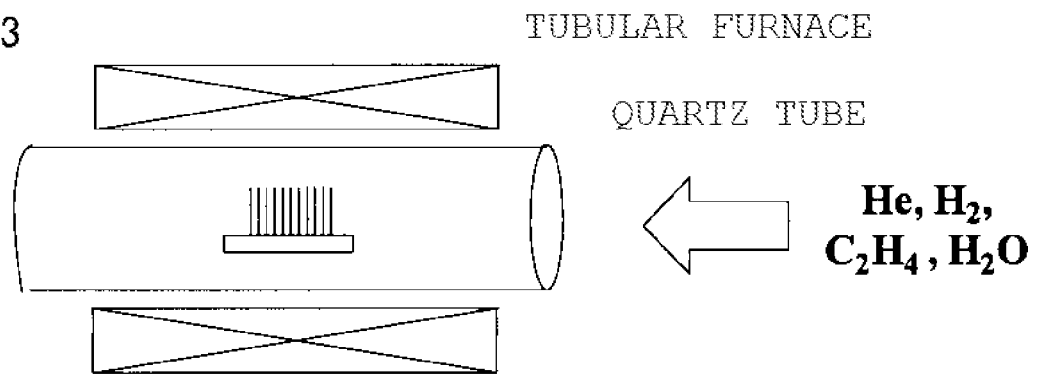
FIG. 3 is a schematic sectional view of a production apparatus for a carbon nanotube aggregate in one embodiment of the present invention.

Any appropriate apparatus may be adopted as an apparatus for forming the carbon nanotube aggregate. The apparatus is, for example, a thermal CVD apparatus of a hot wall type formed by surrounding a cylindrical reaction vessel with a resistance heating electric tubular furnace as illustrated in FIG. 3. In this case, for example, a heat-resistant quartz tube is preferably used as the reaction vessel.

Any appropriate catalyst may be used as the catalyst (material for the catalyst layer) that may be used in the formation of the carbon nanotube aggregate. Examples of the catalyst include metal catalysts, such as iron, cobalt, nickel, gold, platinum, silver, and copper.

In the formation of the carbon nanotube aggregate, an alumina/hydrophilic film may be formed between the smooth plate and the catalyst layer as required.

Any appropriate method may be adopted as a method of producing the alumina/hydrophilic film. For example, the film is obtained by producing a $SiO_2$ film on the smooth plate, depositing Al from the vapor, and increasing the temperature of Al to 450° C. after the deposition to oxidize Al. According to such production method, $Al_2O_3$ interacts with the hydrophilic $SiO_2$ film, and hence an $Al_2O_3$ surface different from that obtained by directly depositing $Al_2O_3$ from the vapor in particle diameter is formed. When Al is deposited from the vapor, and then its temperature is increased to 450° C. so that Al may be oxidized without the production of any hydrophilic film on the smooth plate, it may be difficult to form the $Al_2O_3$ surface having a different particle diameter. In addition, when the hydrophilic film is produced on the smooth plate and $Al_2O_3$ is directly deposited from the vapor, it may also be difficult to form the $Al_2O_3$ surface having a different particle diameter.

Any appropriate method may be adopted as a method of forming the catalyst layer. Examples of the method include a method involving depositing a metal catalyst from the vapor, for example, with an electron beam (EB) or by sputtering and a method involving applying a suspension of metal catalyst fine particles onto the smooth plate.

In one embodiment, the catalyst layer is formed by a sputtering treatment. Any appropriate conditions may be adopted as conditions for the sputtering treatment. Details about the conditions are described later.

The smooth plate A1 is preferably subjected to a pretreatment before the sputtering treatment is performed. The pretreatment is, for example, a treatment involving warming the smooth plate A1. The smooth plate A1 is preferably warmed to from 25° C. to 80° C. by the warming treatment, and is more preferably warmed to from 25° C. to 40° C. The performance of the pretreatment can provide a mounting member that is reduced in loss of its carbon nanotube aggregate and is excellent in low dusting property.

The thickness of the catalyst layer is preferably from 0.01 nm to 20 nm, more preferably from 0.1 nm to 10 nm, still more preferably 0.1 nm or more and less than 3 nm, particularly preferably from 0.5 nm to 2 nm because fine particles are formed on the smooth plate A1. When the thickness falls within such range, a carbon nanotube aggregate excellent in uniformity, that is, such a carbon nanotube aggregate that the standard deviation of the diameters and/or wall numbers of its carbon nanotubes is small can be formed. In addition, a carbon nanotube aggregate having both excellent mechanical characteristics and a high specific surface area, and exhibiting an excellent friction characteristic can be obtained.

Any appropriate carbon source may be used as the carbon source to be filled in the step c. Examples thereof include: hydrocarbons, such as methane, ethylene, acetylene, and benzene; and alcohols, such as methanol and ethanol.

Any appropriate temperature may be adopted as a production temperature in the formation of the carbon nanotube aggregate (production temperature in the step c). For example, in order that catalyst particles that can sufficiently express the effects of the present invention may be formed, the production temperature is preferably from 400° C. to 1,000° C., more preferably from 500° C. to 900° C., still more preferably from 600° C. to 800° C.

The carbon nanotube aggregate may be formed on the smooth plate as described above. In one embodiment, a structure including the carbon nanotube aggregate and the smooth plate is defined as a mounting member. In this case, the smooth plate A3 corresponds to the substrate (the substrate 20 of FIG. 1). In another embodiment, a mounting member is obtained by transferring the carbon nanotube aggregate from the smooth plate onto the substrate.

EXAMPLES

Now, the present invention is described by way of Examples. However, the present invention is not limited thereto. Various evaluations and measurements were performed by the following methods.

(1) Ratio of Plan View Area of Recessed Portions in Carbon Nanotube Aggregate-Side Surface and Number Thereof The surface image of a carbon nanotube aggregate-side surface was acquired with a SEM from directly above (no tilt angle). A 1-centimeter square was observed, and was binarized on software, followed by the measurement of the ratio of the plan view area of recessed portions whose opening portions each had a diameter of 10 µm or more, and the number thereof.

(2) Evaluation of Number of Wafer-Transferred Particles

An 8-inch wafer made of silicon (manufactured by Valqua FFT Inc., thickness: 700 µm) was placed in a clean room, and a mounting member cut into a 1-centimeter square was placed on the wafer so that its carbon nanotube aggregate-side surface was brought into contact with the wafer. The resultant was left to stand for 30 seconds while a load of 100 g was applied from above the mounting member. After that, the number of particles (diameter: 0.2 µm or more) remaining on the surface of the wafer brought into contact with the mounting member was measured with a wafer-evaluating apparatus (manufactured by KLA-Tencor, product name: "Surfscan SP1").

Example 1

A silicon substrate (manufactured by Valqua FFT Inc., thickness: 700 µm, size: 10 mm by 10 mm) was prepared (step a). After that, as a pretreatment, the silicon substrate was warmed to 26° C. Next, an $Al_2O_3$ thin film (ultimate vacuum: $8.0 \times 10^{-4}$ Pa, sputtering gas: Ar, gas pressure: 0.50 Pa, growth rate: 0.12 nm/sec, thickness: 20 nm) was formed on the silicon substrate with a sputtering apparatus (manufactured by Shibaura Mechatronics Corporation, product name: "CFS-4ES"). An Fe thin film was further formed as a catalyst layer (sputtering gas: Ar, gas pressure: 0.75 Pa, growth rate: 0.012 nm/sec, thickness: 1.0 nm) on the $Al_2O_3$ thin film with the sputtering apparatus (manufactured by Shibaura Mechatronics Corporation, product name: "CFS-4ES") (step b).

After that, the substrate was placed in a quartz tube of 30 mmφ, and a helium/hydrogen (105/80 sccm) mixed gas whose moisture content was kept at 700 ppm was flowed into the quartz tube for 30 minutes to purge the tube. After that, a temperature in the tube was increased to 765° C. with an electric tubular furnace, and was stabilized at 765° C. While the temperature was kept at 765° C., the tube was filled with a helium/hydrogen/ethylene (105/80/15 sccm, moisture content: 700 ppm) mixed gas, and the resultant was left to stand for 60 minutes to align carbon nanotubes in a perpendicular direction on the substrate (step c). Thus, a mounting member was obtained. The mounting member had a size measuring 10 mm by 10 mm. That is, the mounting member was obtained without the inclusion of a step of dividing the silicon substrate into individual pieces after the step a.

The resultant mounting member was subjected to the evaluations (1) and (2). The results are shown in Table 1.

Example 2

A silicon substrate (manufactured by Silicon Technology Co., Ltd., thickness: 700 μm, size: 200 mmφ (an 8-inch wafer was used as it was)) was prepared (step a). After that, as a pretreatment, the silicon substrate was warmed to 26° C. Next, an $Al_2O_3$ thin film (ultimate vacuum: $8.0 \times 10^{-4}$ Pa, sputtering gas: Ar, gas pressure: 0.50 Pa, growth rate: 0.12 nm/sec, thickness: 20 nm) was formed on the silicon substrate with a sputtering apparatus (manufactured by Shibaura Mechatronics Corporation, product name: "CFS-4ES"). An Fe thin film was further formed as a catalyst layer (thickness: 1.0 nm) on the $Al_2O_3$ thin film with the sputtering apparatus (manufactured by Shibaura Mechatronics Corporation, product name: "CFS-4ES") (step b).

Next, the silicon substrate having formed thereon the catalyst layer was cut into a size measuring 10 mm by 10 mm.

Next, the substrate obtained by the cutting was placed in a quartz tube of 30 mmφ, and a helium/hydrogen (105/80 sccm) mixed gas whose moisture content was kept at 700 ppm was flowed into the quartz tube for 30 minutes to purge the tube. After that, a temperature in the tube was increased to 765° C. with an electric tubular furnace, and was stabilized at 765° C. While the temperature was kept at 765° C., the tube was filled with a helium/hydrogen/ethylene (105/80/15 sccm; moisture content: 700 ppm) mixed gas, and the resultant was left to stand for 60 minutes to align carbon nanotubes in a perpendicular direction on the substrate (step c). Thus, a mounting member was obtained.

The resultant mounting member was subjected to the evaluations (1) and (2). The results are shown in Table 1.

Example 3

A mounting member was obtained in the same manner as in Example 2 except that the thickness of the catalyst layer was set to 2 nm. The resultant mounting member was subjected to the evaluations (1) and (2). The results are shown in Table 1.

Comparative Example 1

A mounting member was obtained in the same manner as in Example 2 except that the warming (26° C.) serving as the pretreatment was not performed. The resultant mounting member was subjected to the evaluations (1) and (2). The results are shown in Table 1.

Comparative Example 2

A mounting member was obtained in the same manner as in Example 1 except that: the warming (26° C.) serving as the pretreatment was not performed; and the thickness of the catalyst layer was set to 2 nm. The resultant mounting member was subjected to the evaluations (1) and (2). The results are shown in Table 1.

TABLE 1

|  | Area ratio of recessed portions (%) | Number of recessed portions (recessed portions/cm$^2$) | Wafer-transferred particles (particles/cm$^2$) |
|---|---|---|---|
| Example 1 | 0 | 0 | 11 |
| Example 2 | 1.9 | 27 | 41 |
| Example 3 | 4.3 | 75 | 122 |
| Comparative Example 1 | 7.3 | 91 | 270 |
| Comparative Example 2 | 11.5 | 1,600 | 823 |

As is apparent from Table 1, the mounting member of the invention of the present application in which the ratio of the plan view area of recessed portions occurring in its carbon nanotube aggregate-side surface is 5% or less is excellent in low dusting property.

REFERENCE SIGNS LIST

10 carbon nanotube aggregate
11 carbon nanotube
20 substrate
100, 200 mounting member

The invention claimed is:

1. A mounting member, comprising an aggregate of carbon nanotubes for forming a mounting surface, wherein a ratio of a plan view area of recessed portions occurring in a carbon nanotube aggregate-side surface of the mounting member to a total area of the carbon nanotube aggregate-side surface is 5% or less.

2. The mounting member according to claim 1, further comprising a substrate, wherein the aggregate of the carbon nanotubes is fixed to the substrate.

3. The mounting member according to claim 1, wherein opening portions of the recessed portions each have a diameter of 1,000 μm or less.

4. The mounting member according to claim 1, wherein a number of the recessed portions is 80 recessed portions/cm$^2$ or less.

5. The mounting member according to claim 1, wherein an average of diameters of the carbon nanotubes is from 1 nm to 800 nm.

6. The mounting member according to claim 1, wherein a portion including a tip of each of the carbon nanotubes is covered with an inorganic material.

7. The mounting member according to claim 1, wherein the mounting member is used in transport of a semiconductor part.

* * * * *